(12) United States Patent
Seidler et al.

(10) Patent No.: US 12,133,475 B2
(45) Date of Patent: Oct. 29, 2024

(54) COMPONENT HAVING A BAND ASSEMBLY FOR INDIVIDUAL ELECTRON MOVEMENT OVER A LONG DISTANCE

(71) Applicants: Rheinisch-Westfälische Technische Hochschule (RWTH) Aachen, Aachen (DE); Forschungszentrum Jülich GmbH, Jülich (DE)

(72) Inventors: Inga Seidler, Aachen (DE); Hendrik Bluhm, Aachen (DE); Lars Schreiber, Aachen (DE); Matthias Künne, Aachen (DE)

(73) Assignees: Rheinisch-Westfälische Technische Hochschule (RWTH) Aachen, Aachen (DE); Forschungszentrum Jülich GmbH, Jülich (DE)

( * ) Notice: Subject to any disclaimer, the term of this patent is extended or adjusted under 35 U.S.C. 154(b) by 197 days.

(21) Appl. No.: 17/636,522

(22) PCT Filed: Sep. 1, 2020

(86) PCT No.: PCT/DE2020/100766
§ 371 (c)(1),
(2) Date: Feb. 18, 2022

(87) PCT Pub. No.: WO2021/052531
PCT Pub. Date: Mar. 25, 2021

(65) Prior Publication Data
US 2022/0293846 A1 Sep. 15, 2022

(30) Foreign Application Priority Data
Sep. 20, 2019 (DE) .................... 10 2019 125 351.9

(51) Int. Cl.
*H10N 60/10* (2023.01)
*B82Y 10/00* (2011.01)
(Continued)

(52) U.S. Cl.
CPC .......... *H10N 60/128* (2023.02); *G06N 10/00* (2019.01); *G06N 10/40* (2022.01); *H01L 29/401* (2013.01);
(Continued)

(58) Field of Classification Search
CPC ...... H10N 60/128; H10N 60/11; G06N 10/40; G06N 10/00; H01L 29/401; H01L 29/762;
(Continued)

(56) References Cited

U.S. PATENT DOCUMENTS 8,164,082 B2 4/2012 Friesen
11,171,225 B2 11/2021 Voinigescu et al.
(Continued)

FOREIGN PATENT DOCUMENTS

AU 2007200501 A1 8/2008
DE 102019202661 A1 8/2020
(Continued)

OTHER PUBLICATIONS

Electron spins in few-electron lateral quantum dots, Laurens Henry Willems Van Beveren, (Tech Univ DELFT), Thesis (Year: 2005).*
(Continued)

*Primary Examiner* — Arnold M Kinkead
(74) *Attorney, Agent, or Firm* — Smartpat PLC (57) ABSTRACT

An electronic component (10, 110) is designed as a semiconductor or with a semiconductor-like structure for moving a quantum dot (68, 168) over a distance. The electronic component (10, 110) comprises a substrate (32, 132) having a two-dimensional electron gas or electron hole gas. A gate electrode assembly (16, 18, 20, 116, 118, 120) having gate electrodes (38, 40, 42, 44, 138, 140, 142, 144) is arranged on a surface (31, 131) of the electronic component (10, 110). The gate electrode assembly (16, 18, 20, 116, 118, 120)
(Continued)

produces a potential well (66, 166) in the substrate (32, 132). Electrical terminals for connecting the gate electrode assembly (16, 18, 20, 116, 118, 120) to voltage sources are provided for this purpose. The disclosure further relates to a method for such an electronic component (10, 110).

7 Claims, 7 Drawing Sheets

(51) Int. Cl.
*G06N 10/00* (2022.01)
*G06N 10/40* (2022.01)
*H01L 29/40* (2006.01)
*H01L 29/762* (2006.01)

(52) U.S. Cl.
CPC ........... *H01L 29/762* (2013.01); *H10N 60/11* (2023.02); *B82Y 10/00* (2013.01)

(58) Field of Classification Search
CPC ............... H01L 29/423; H01L 29/7613; H01L 29/66977; B82Y 10/00
USPC ............. 326/6; 505/832, 842; 365/160, 161, 365/162; 977/932, 933
See application file for complete search history.

(56) References Cited

U.S. PATENT DOCUMENTS

| | | |
|---|---|---|
| 2008/0185576 A1 | 8/2008 | Hollenberg et al. |
| 2015/0279981 A1 | 10/2015 | Eriksson et al. |
| 2016/0125310 A1 | 5/2016 | Hollenberg et al. |
| 2016/0275410 A1 | 9/2016 | Rogge et al. |
| 2017/0317203 A1 | 11/2017 | Petta et al. |
| 2018/0226451 A1 | 8/2018 | Dzurak et al. |
| 2020/0176569 A1 | 6/2020 | Singh et al. |
| 2020/0312990 A1 | 10/2020 | Roberts et al. |
| 2021/0279134 A1 | 9/2021 | Versluis et al. |
| 2022/0005943 A1 | 1/2022 | Roberts et al. |
| 2022/0172097 A1 | 6/2022 | Langrock et al. |
| 2023/0197833 A1 | 6/2023 | Thomas et al. |

FOREIGN PATENT DOCUMENTS

| | | |
|---|---|---|
| EP | 2075745 A1 | 7/2009 |
| EP | 2560133 A1 | 2/2013 |
| EP | 3016035 A3 | 1/2019 |
| EP | 3016035 B1 | 1/2019 |
| EP | 4075153 A1 | 10/2022 |
| JP | S5994458 U | 6/1984 |
| WO | 2014146162 A1 | 9/2014 |
| WO | 2017020095 A1 | 2/2017 |
| WO | 2017213651 A1 | 12/2017 |
| WO | 2018062991 A1 | 4/2018 |
| WO | 2018236403 A1 | 12/2018 |

OTHER PUBLICATIONS

G.J. Schinner et al., "Confinement and Interaction of Single Indirect Excitons in a Voltage-Controlled Trap Formed Inside Double InGaAs Quantum Wells", New Journal of Physics, vol. 110, issue. 12, pp. 127403-127408, Mar. 19, 2013.

High, A. A., et al. "Trapping indirect excitons in a GaAs quantum-well structure with a diamond-shaped electrostatic trap." Physical review letters 103.8 (2009): 087403.

Horsman, Clare, et al. "Surface code quantum computing by lattice surgery." New Journal of Physics 14.12 (2012): 123011.

Künne et al., co-pending U.S. Appl. No. 17/642,484, national phase entry of PCT/DE2020/100812.

Künne et al., co-pending U.S. Appl. No. 17/642,527; national phase entry of PCT/DE2020/100811.

Künne et al., co-pending U.S. Appl. No. 17/642,677; national phase entry of PCT/DE2020/100809.

Künne et al., co-pending U.S. Appl. No. 17/761,832; national phase entry of PCT/DE2020/100814.

Künne et al., co-pending U.S. Appl. No. 17/636,522; national phase entry of PCT/DE2020/100766.

Künne et al., co-pending U.S. Appl. No. 17/761,885; national phase entry of PCT/DE2020/100810.

Schinner, G. J., et al. "Electrostatically trapping indirect excitons in coupled In x Ga 1-x As quantum wells." Physical Review B 83.16 (2011): 165308.

Veit Langrock, Numerical and theoretical investigation of long-range coherent electron shuttling devices in Silicon/Silicon-Germanium quantum wells for scalable quantum computing, Nov. 30, 2017, retrieved online from https://www.quantuminfo.physik.rwth-aachen.de/global/show_document.asp?id=aaaaaaaaabbnooi.

* cited by examiner

COMPONENT HAVING A BAND ASSEMBLY FOR INDIVIDUAL ELECTRON MOVEMENT OVER A LONG DISTANCE

TECHNICAL FIELD

The disclosure relates to an electronic component which is designed as a semiconductor or with a semiconductor-like structure for moving a quantum dot over a distance. The disclosure further relates to a method for such an electronic component.

BACKGROUND

Conventional computers use semiconductor components with integrated circuits. These circuits always work with systems which are based on a logical "0" or "1"—i.e. the switch is "on" or "off". In the case of semiconductor memories, this is realized in that the potential is either above or below a threshold value. These two states form the smallest unit in computers and are referred to as "bits".

These semiconductor components often consist of doped silicon elements in order to realize the circuits. For example, transistor circuits can be arranged in such semiconductor components and linked to form a logic circuit. Through continuously improving chemical and physical manufacturing processes, these semiconductor components can now be produced with increasingly extreme compactness. However, this compactness has reached its physical limits. The density of the circuits as well as the temperature often leads to problems in such semiconductor components. In this manner, optimizations in particular can be achieved through multilayer models, higher switching speeds, or the selection of the semiconductor material. Nevertheless, the computing power is often insufficient for many applications, e.g. in cryptographic technology or when calculating weather or climate models, due to the enormous amounts of data.

To increase computing power significantly, models for so-called quantum computers have long been known. For a variety of reasons, though, it has not yet been technically feasible to implement them. The quantum computer models are designed to exploit the quantum mechanical states of particles such as electrons. A quantum mechanical system with two states as the smallest unit for storing information is referred to as a "qubit". A qubit is defined, for example, by its quantum mechanical spin state, which can be "up" or "down".

The principle of electron spin qubits is always the same, regardless of the material system selected. A semiconductor heterostructure serves as the substrate in this case. The semiconductor heterostructure comprises a two-dimensional electron gas (2DEG). Semiconductor heterostructures are monocrystalline layers of semiconductors with different compositions grown on top of each other. These layer structures provide numerous technically relevant quantization effects in terms of their electronic and optical properties. For this reason, they are particularly suitable for use in the production of microelectronic components. Currently, the most important combination of materials for the production of semiconductor heterostructures is the GaAs/AlGaAs system.

Semiconductor heterostructures form so-called quantum films at the interfaces between different materials. These arise in particular because of the different energy levels in the two materials. The defined energy distribution resulting therefrom causes charge carriers from the surrounding area to collect in the quantum film. Their freedom of movement is largely restricted to the layer, and they form the two-dimensional electron gas (2DEG).

A nanoscopic material structure is referred to as a quantum dot. Semiconductor materials are particularly suitable for this. The mobility of the charge carriers, both electrons and holes, is so restricted in a quantum dot that their energy can no longer assume continuous values, and can thus only assume discrete values. Using nanoscale gate electrodes (also referred to as gates), which are applied to the surface of the component, the potential landscape within the two-dimensional electron gas (2DEG) is shaped in such a manner that individual electrons can be captured in the quantum dots. The spins of these electrons then serve as the basis for the formation of a logical qubit.

US 2017/0317203 A1 discloses a quantum dot device comprising at least three conductive layers and at least two insulating layers. The three conductive layers are electrically insulated from one another. It is described there that one conductive layer is composed of a different material than the other two conductive layers. The conductive layers can include or be composed entirely of aluminum, gold, copper, or polysilicon, for example. The insulating layers, on the other hand, are composed of silicon oxide, silicon nitride, and/or aluminum oxide, for example. The connections between the conductive layers and the insulating layers can cause, inter alia, individual electrons to be shuttled through quantum dots of the device using voltage pulses.

In this quantum dot device, an electron is confined in a potential well. Through quantum mechanical tunneling, an electron is moved from quantum dot to quantum dot. This can lead to inaccuracies or falsifications of the information regarding the quantum mechanical state when an electron moves over longer distances.

To implement a universal quantum computer, it must be possible to couple the qubits over distances of at least a few micrometers, in particular to create space for local control electronics. There are already approaches in the state of the art in which one or two-dimensional arrays were built from separate quantum dots, through which electrons can then be transported. Due to the very large number of gate electrodes required and corresponding voltages to be set, coupling over several micrometers is impossible to implement or can only be implemented with considerable effort using this approach.

While operations on individual qubits can already be checked and evaluated to a satisfactory extent, the ability to couple qubits is possibly the main problem still to be solved in order to realize a universal quantum computer.

SUMMARY

The object of the invention is to eliminate the disadvantages of the prior art and to produce a coupling, in particular between qubits, over a distance greater than 100 nm.

The object is achieved in that in an electronic component designed as a semiconductor or with a semiconductor-like structure for moving a quantum dot over a distance, comprises
  a) a substrate with a two-dimensional electron gas or electron hole gas;
  b) a gate electrode assembly having gate electrodes, which is arranged on a surface of the electronic component, for producing a potential well in the substrate;
  c) electrical terminals for connecting the gate electrode assembly to voltage sources, wherein
  d) the gate electrodes have parallel electrode fingers, whereby e) the electrode fingers are interconnected in a periodically alternating manner, which causes an almost continuous movement of the potential well through the substrate, whereby a quantum dot is transported with this potential well.

The object is also achieved by a method for such an electronic component in which a phase-shifted voltage is applied to the interconnected gate electrodes, which causes an almost continuous movement of the potential well through the substrate, whereby a quantum dot is transported with this potential well.

The invention is based on the principle that a quantum mechanical state is set in a quantum dot, which can then be transported through the substrate over a longer distance. For this purpose, the quantum dot is confined in the potential well, which is generated in a suitable manner by the gate electrode assembly. The potential well then moves continuously and in a directed manner through the substrate and carries the quantum dot with its quantum mechanical state over the distance. To enable continuous movement of the potential well, the electrode fingers of the gate electrodes are connected accordingly. With the present invention, a quantum mechanical state of a quantum dot can thus be moved over a greater distance.

In a preferred embodiment of the electronic component, a gate electrode assembly comprises two parallel gate electrodes that form a channel-like structure. This measure serves to ensure that the potential well can only move along a certain path in the substrate.

In an advantageous embodiment of such an electronic component, the substrate contains gallium arsenide (GaAs) and/or silicon germanium (SiGe). These materials are able to generate a two-dimensional electron gas in which quantum dots can be produced and transported. In the case of gallium arsenide, the quantum dots are occupied by electrons. In the case of silicon germanium, the quantum dots are occupied by holes that are missing an electron.

A further preferred embodiment of the electronic component can be achieved in that the respectively interconnected gate electrodes are configured such that a periodic and/or phase-shifted voltage can be applied to them. This measure enables the potential well to be guided continuously through the substrate. A quantum dot located in the potential well can thus be transported through the substrate with the potential well while not losing its original quantum mechanical state.

In a preferred embodiment of the electronic component, at least every third one of the electrode fingers of the gate electrodes is interconnected. This is to ensure that the potential well is always guaranteed over at least one period through which the potential well is moved. Only in this way is it possible to ensure continuous movement of the potential well with the quantum dot. In principle, other combinations are also possible when interconnecting gate electrodes as long as the potential well can be moved together with the quantum dot. Correspondingly, an advantageous embodiment for the method for an electronic component is obtained in that at least every third gate electrode is interconnected and a voltage is applied periodically to the interconnected gate electrodes.

In a further advantageous embodiment of the electronic component, means are provided for connecting two qubits of a quantum computer. Transporting the states of quantum dots over a greater distance is particularly suitable for quantum computers. It is necessary here to connect qubits to one another. For this reason, the electronic component must provide contacts to connect at least two qubits in order to transfer the quantum states of the quantum dots from one qubit to another qubit.

Further embodiments and advantages will become apparent from the subject matter of the subclaims and the drawings with the accompanying descriptions. Exemplary embodiments are explained in more detail below with reference to the accompanying drawings. The invention should not be limited solely to the exemplary embodiments listed. The present invention is intended to refer to all objects that a person skilled in the art would deem obvious now and in the future to realize the invention. The following detailed description refers to the best embodiments currently possible of the disclosure. They are only intended to illustrate the invention in more detail. The description is therefore not to be understood in a limiting sense, but is merely intended to illustrate the general principles of the invention since the scope of the invention is best defined by the appended claims. The cited prior art is considered part of the disclosure relating to the invention.

DETAILED DESCRIPTION

Figure 1:
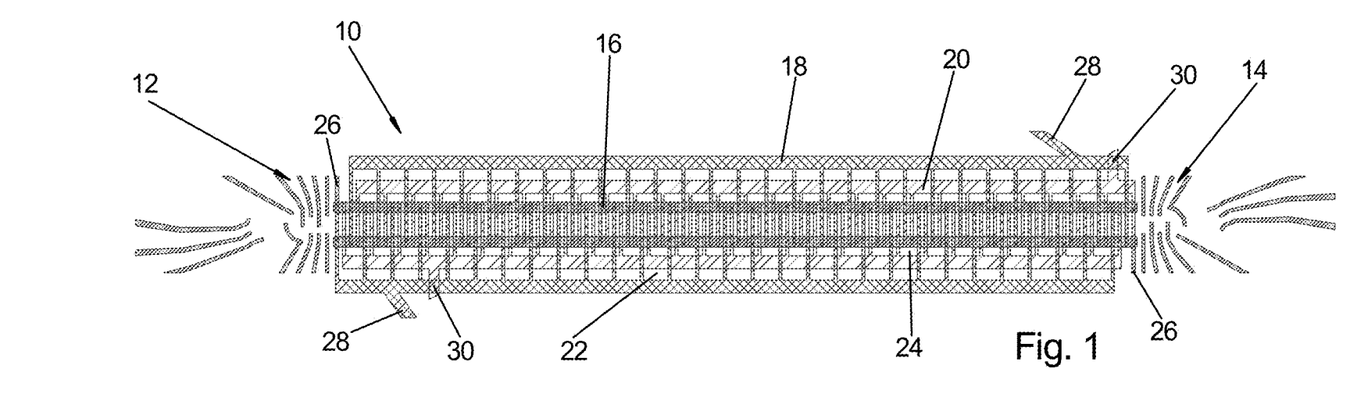
FIG. 1 shows the schematic top view of an electronic component made of GaAs, which is arranged between two qubits.

FIG. 1 shows a first exemplary embodiment of an electronic component 10 or component based on gallium arsenide (GaAs). The electronic component 10 is shown schematically in a top view. The structures of the component are preferably nanoscale structures. The electronic component 10 couples two qubits 12, 14 to one another. In the present exemplary embodiment, the electronic component 10 comprises three layers of gate electrode assemblies 16, 18, 20, which are separated from one another by insulating layers 22, 24. The gate electrode assemblies 16, 18, 20 are supplied with a suitable voltage via electrical connections 26, 28, 30.

The first and lowermost gate electrode assembly 16 rests on a flat outer surface 31 of a substrate 32. In the present exemplary embodiment, the substrate 32 is comprised of doped gallium arsenide (GaAs). The layer of the first gate electrode assembly 16 is followed by the insulating layer 22, on which the second gate electrode assembly 18 is provided. The insulating layer 24, which electrically isolates the second gate electrode assembly 18 from the third and uppermost gate electrode assembly 20, lies on the second gate electrode assembly 18.

Figures 2, 3:
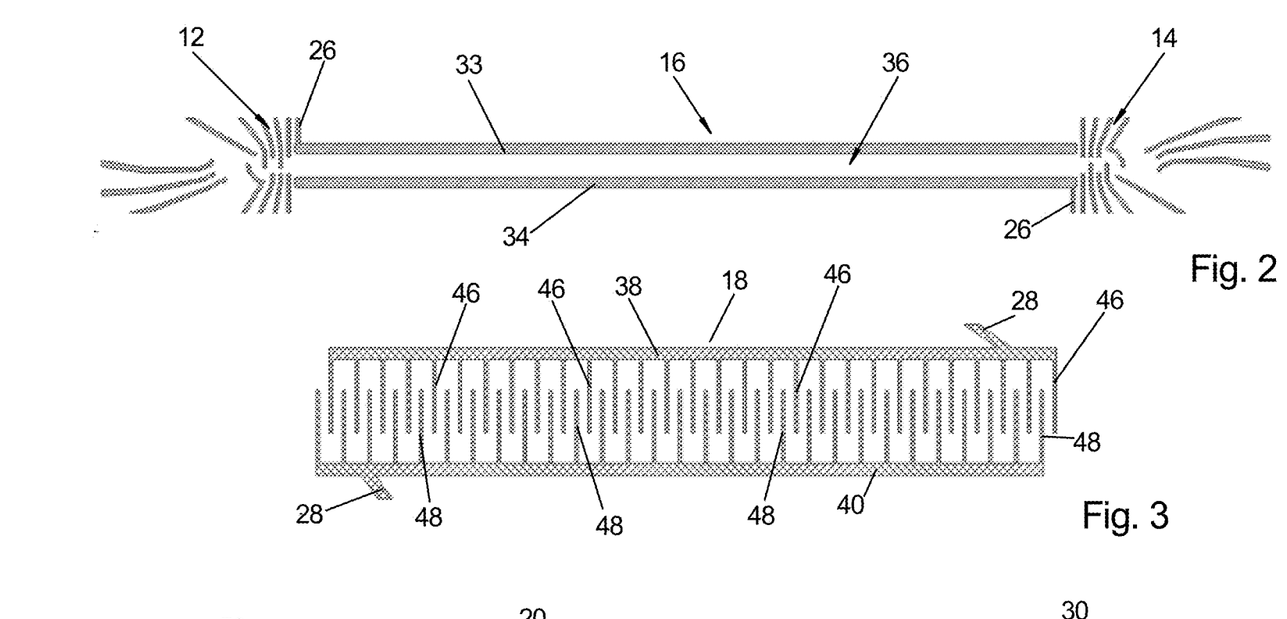
FIG. 2 shows a top view of a first layer of the gate electrode assembly according to FIG. 1.
FIG. 3 shows a top view of a second layer of the gate electrode assembly according to FIG. 1.

In FIG. 2 according to FIG. 1, the arrangement of the first gate electrode assembly 16, which connects the qubits 12, 14 to one another, is shown schematically. This gate electrode assembly 16 comprises two parallel gate electrodes 33, 34, which have the first electrical connections 26 for the supply voltage. The gate electrodes 33, 34 form a channel-like structure 36.

Figure 4:
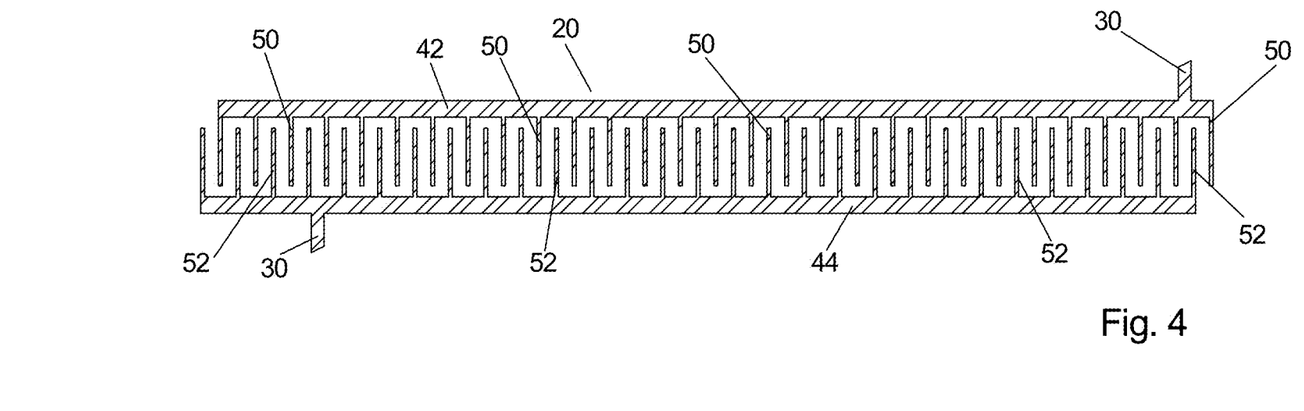
FIG. 4 shows a top view of a third layer of the gate electrode assembly according to FIG. 1.

FIGS. 3 and 4 according to FIG. 1 show a schematic of the second and third gate electrode assemblies 18, 20, each of which comprises two gate electrodes 38, 40 and 42, 44, respectively, arranged in parallel. Each of these gate electrodes 38, 40, 42, 44 has an electrical connection 28, 30 for the supply voltage. These gate electrodes 38, 40, 42, 44 are finger-shaped with electrode fingers 46, 48, 50, 52. The electrode fingers 46, 48, 50, 52, which are spaced apart, engage one another in a plane 54, 56 of the gate electrode assemblies 18, 20 without touching one another. The gate electrode assemblies 18, 20 are arranged offset to one another in a suitable manner so that the electrode fingers 46, 48, 50, 52 are shifted with respect to each other in an alternating manner in the top view.

Figure 5:
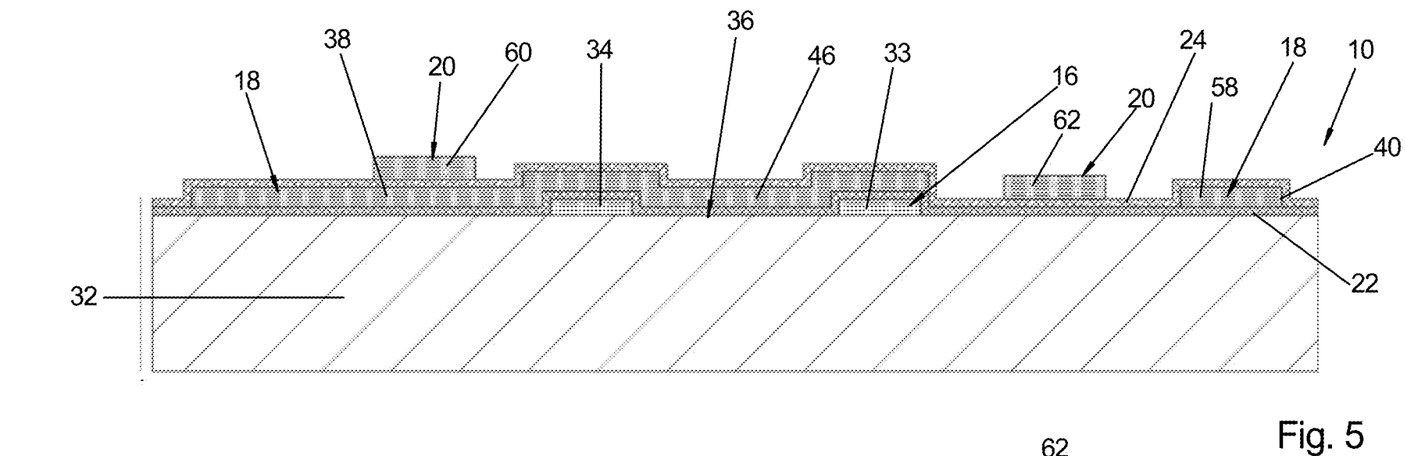
FIG. 5 shows a schematic diagram of a cross-section through the second layer of the gate electrode assembly according to FIG. 1.
Figure 6:
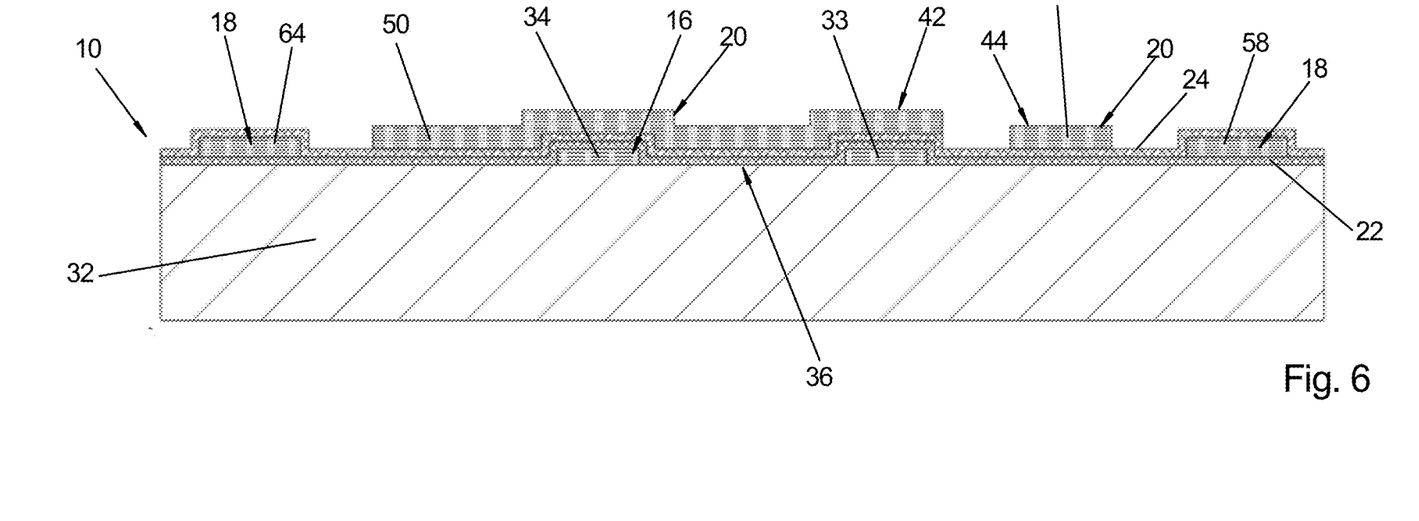
FIG. 6 shows a schematic diagram of a cross-section through the third layer of the gate electrode assembly according to FIG. 1.

In FIGS. 5 and 6 according to FIG. 1, a cross section of the electronic component 10 is shown schematically. FIG. 5 shows a section A-A according to FIG. 7 through the second layer, and FIG. 6 shows a section B-B according to FIG. 7 through the third layer. The gate electrode assemblies 16, 18, 20 and the insulating layers 22, 24 are arranged above the substrate 32.

In section A-A in FIG. 5, the channel-like structure 36 of the first gate electrode assembly 16, which rests directly on the substrate 32, is clearly visible. For this purpose, the two gate electrodes 33, 34 are arranged in parallel with a channel-like structure 36. The first insulating layer 22 is provided over the gate electrodes 33, 34. The second gate electrode assembly 18 is located on this insulating layer 22. One electrode finger 46 of the gate electrode 38 of the second gate electrode assembly 18 is visible on the first insulating layer 22 in this diagram of the sectional area. In the sectional diagram, one connection 58 for the electrode finger 48 of gate electrode 40 of the second gate electrode assembly 18 is visible (FIG. 3). The second insulating layer 24, on which the third gate electrode assembly 20 is arranged, is provided over the second gate electrode assembly 18. In the section shown, only one connection 60, 62 of each of the gate electrodes 42, 44 of the third gate electrode assembly 20 is visible between the electrode fingers 50, 52 (FIG. 4).

Analogous to FIG. 5, the channel-like structure 36 of the first gate electrode assembly 16 is also visible in section B-B in FIG. 6, which extends unchanged along the entire electronic component 10 (see FIG. 1). In FIG. 6, the first gate electrode assembly 16 lies on the substrate 32. The first insulating layer 22 is located above the gate electrodes 33, 34 of the gate electrode assembly 16. The second gate electrode assembly 18 is located on this insulating layer 22. In the section shown, only one connection 58, 64 of each of the gate electrodes 38, 40 of the second gate electrode assembly 18 is visible between the electrode fingers 46, 48 (FIG. 3). The second insulating layer 24, on which the third gate electrode assembly 20 is arranged, is provided over the second gate electrode assembly 18. One electrode finger 50 of the gate electrode 42 of the third gate electrode assembly 20 is visible on the second insulating layer 24 in this diagram of the sectional area. Only the connection 62 of the gate electrode 44 of the third gate electrode assembly 20 is visible here.

Figure 7:
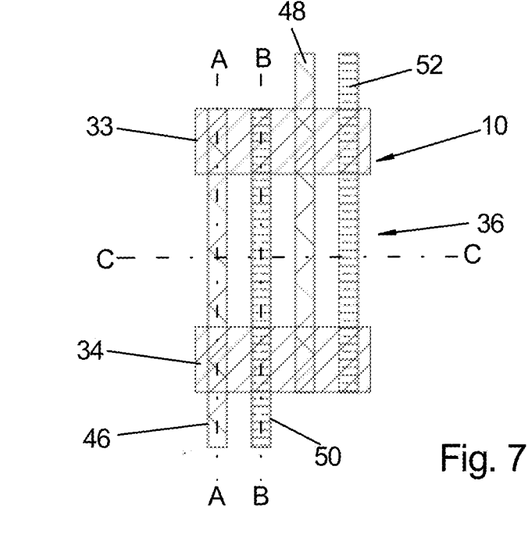
FIG. 7 shows a schematic top view of the structure of the electronic component according to FIG. 1 for a single period.

FIG. 7 is shown according to FIG. 1 in a schematic top view of the electronic component 10 as an enlarged section for a single period. The channel-like structure 36 of the first gate electrode assembly 16 is shown as the lowest layer. As described above, the second and third gate electrode assemblies 18, 20, which are insulated from one another, are located above this. The electrode fingers 46, 48 of the gate electrodes 38, 40 of the second gate electrode assembly 18 engage in one another without contact in the plane 54. The electrode fingers 50, 52 of the gate electrodes 42, 44 of the third gate electrode assembly 20 engage in one another without contact in the plane 56. The gate electrodes 38, 40 and 42, 44 are arranged such that the electrode fingers 46, 48, 50, 52 alternate.

Figure 8:
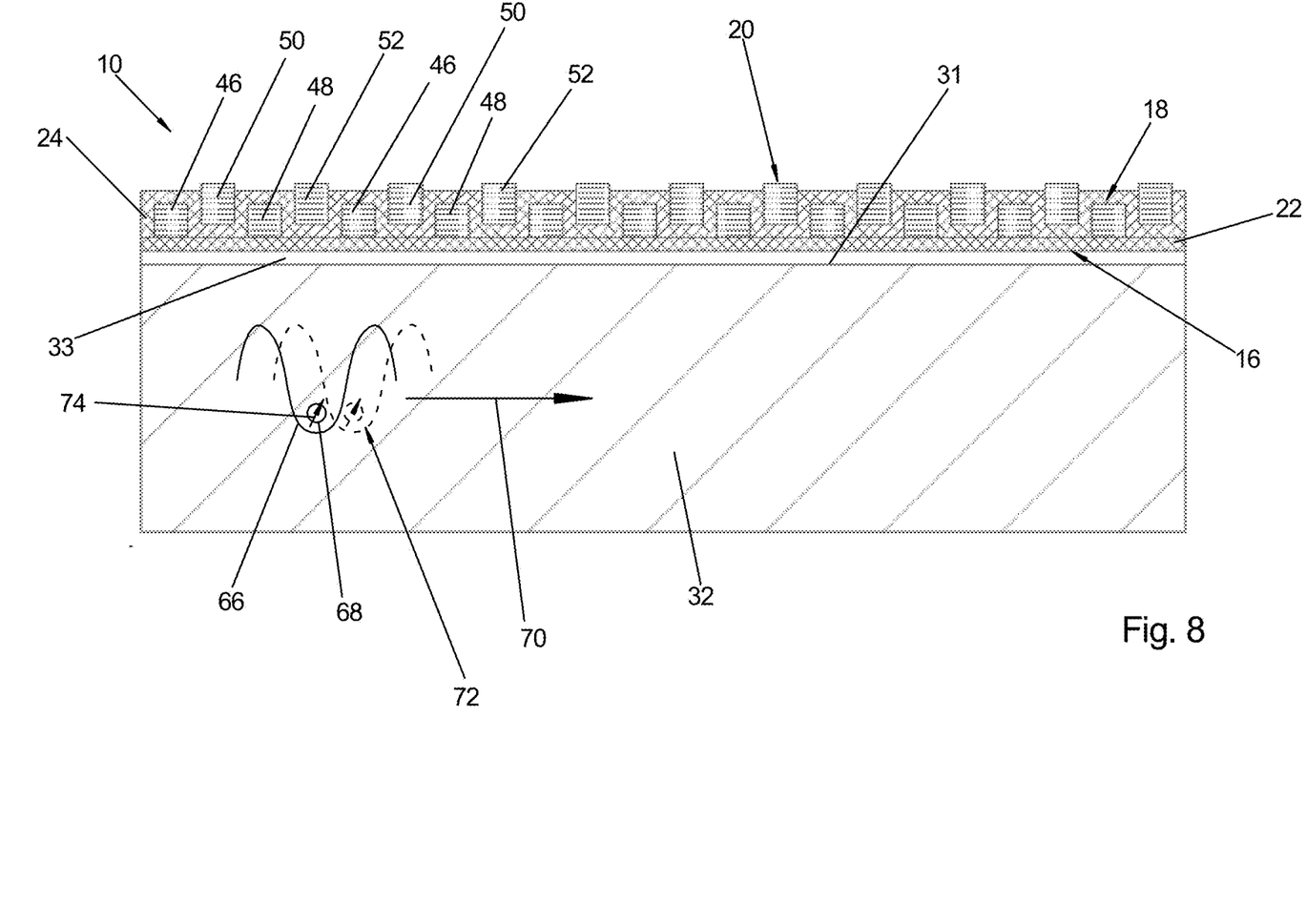
FIG. 8 shows a longitudinal section according to FIG. 1 through the electronic component.

FIG. 8 shows, as a section of the electronic component 10, a longitudinal section C-C according to FIG. 7. The two-dimensional electron gas (2DEG) is formed in the substrate 32 of the electronic component 10. In this cross-sectional view, the gate electrode 33 of the first gate electrode assembly 16 is visible. The gate electrode 33 extends longitudinally directly on the outer surface 31 of the substrate 32 and is separated from the second gate electrode assembly 18 by the first insulating layer 22. The transverse electrode fingers 46, 48 of the second gate electrodes 38, 40 can be seen in section. The second gate electrode assembly 18 is separated from the third gate electrode assembly 20 by the second insulating layer 24. Of the third gate electrode assembly 20, only the electrode fingers 50, 52 of the gate electrodes 42, 44 can be seen. In this section, it becomes clear how the electrode fingers 46, 48, 50, 52 alternate. By suitably applying sinusoidal voltages to the gate electrode assemblies 16, 18, 20, a potential well 66 is generated. A quantum dot 68 trapped in this potential well 66 can be transported through the substrate. The potential well 66 is transported longitudinally through the substrate through suitable control of the electrode fingers 46, 48, 50, 52 with sinusoidal voltages, without the quantum dot 68 changing its quantum mechanical properties. The movement of the quantum dot 68 in the direction of the arrow 70 is indicated by a dashed line 72. The quantum mechanical state is represented symbolically by the small arrow 74 of the quantum dot 68.

Voltage is applied to the gate electrode assemblies 16, 18, 20 such that the electrode fingers 46, 48, 50, 52 of the gate electrodes 38, 40 and 42, 44 form the movable potential well 66 in the substrate 32 of the electronic component 10. Through suitable control of the gate electrode assemblies 16, 18, 20, the potential well 66 can be guided in a controlled manner along the channel-like structure 36 through the substrate 32. In the present exemplary embodiment, the gate electrodes 38, 40 and 42, 44 of the second and third gate electrode assemblies 18, 20 have a sinusoidal voltage profile applied to them, which is suitably phase-shifted between the gate electrodes 38, 40, 42, 44. The quantum dot 68, which is confined in this potential well 66, can be transported with this potential well 66 over a distance in the two-dimensional electron gas of the substrate 32 made of GaAs from one qubit 12 to the other qubit 14 without experiencing a quantum mechanical change of state.

Figure 9:
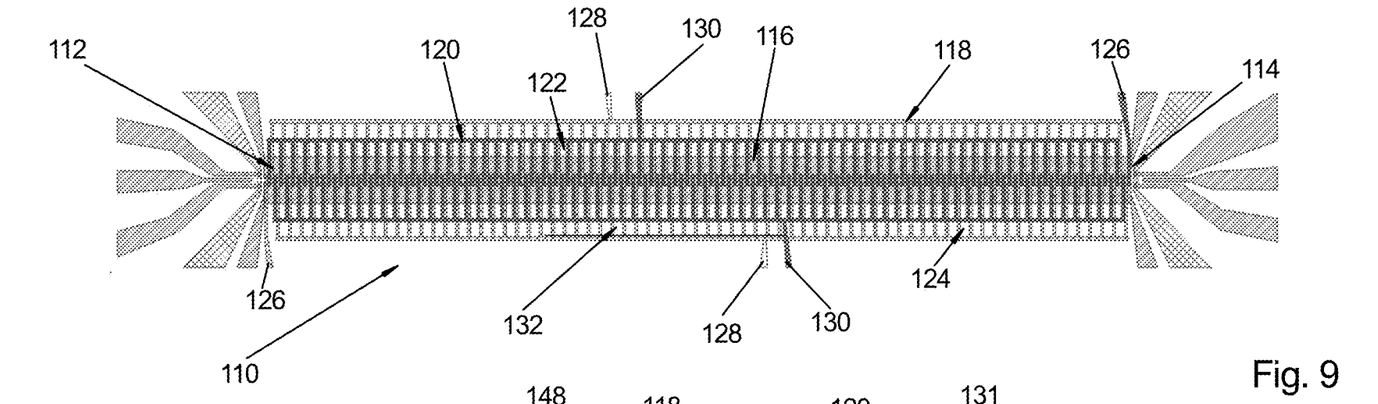
FIG. 9 shows the schematic top view of an electronic component made of SiGe, which is arranged between two qubits.

FIG. 9 shows a second exemplary embodiment for an electronic component 110 based on undoped silicon germanium (SiGe). Due to the opposite polarity with respect to the previous exemplary embodiment with doped GaAs required for this, a slightly different structure of the electronic component is required.

The electronic component 110 is shown schematically in a top view. The electronic component 110 couples two qubits 112, 114 to one another. In the present exemplary embodiment, the electronic component 110 comprises three layers of gate electrode assemblies 116, 118, 120, which are separated from one another by insulating layers 122, 124. The gate electrode assemblies 116, 118, 120 are supplied with a suitable voltage via electrical connections 126, 128, 130.

The first and lowermost gate electrode assembly 116 rests on a flat surface 131 of a substrate 132. In the present exemplary embodiment, the substrate 132 consists of silicon germanium (SiGe). The layer of the first gate electrode assembly 116 is followed by the insulating layer 122, on which the second gate electrode assembly 118 is provided. The insulating layer 124, which electrically isolates the second gate electrode assembly 118 from the third and uppermost gate electrode assembly 120, lies on the second gate electrode assembly 118.

Figures 10, 11:
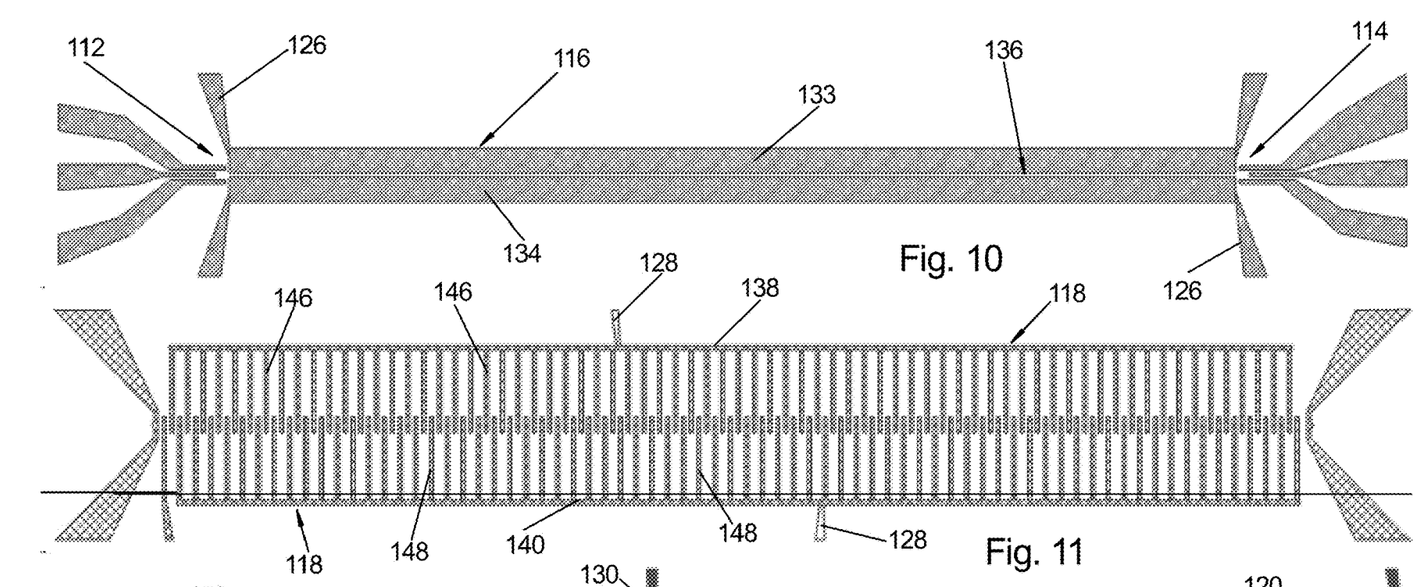
FIG. 10 shows a top view of a first layer of the gate electrode assembly according to FIG. 9.
FIG. 11 shows a top view of a second layer of the gate electrode assembly according to FIG. 9.

FIG. 10 schematically shows the arrangement of the first gate electrode assembly 116, which connects the qubits 112, 114 to one another. This gate electrode assembly 116 comprises two parallel gate electrodes 133, 134, which have the first electrical connections 126 for the supply voltage. The gate electrodes 133, 134 form a channel-like structure 136.

Figure 12:
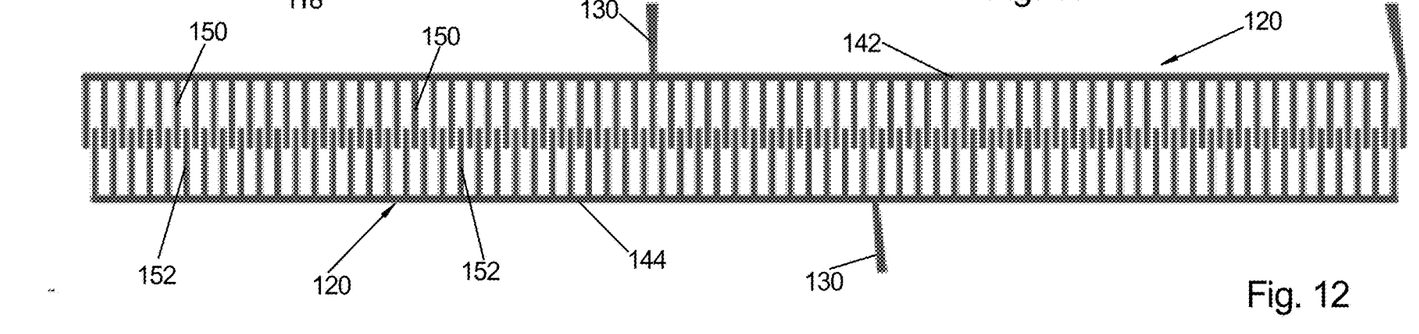
FIG. 12 shows a top view of a third layer of the gate electrode assembly according to FIG. 9.

FIGS. 11 and 12 schematically show the second and third gate electrode assemblies 118, 120, each of which comprises two gate electrodes 138, 140 and 142, 144, respectively, arranged in parallel. Each of these gate electrodes 138, 140, 142, 144 has an electrical connection 128, 130 for the supply voltage. These gate electrodes 138, 140, 142, 144 are finger-shaped with electrode fingers 146, 148, 150, 152. The electrode fingers 146, 148, 150, 152, which are spaced apart, engage one another in a plane 154, 156 of the gate electrode assemblies 118, 120 without touching one another. The gate electrode assemblies 118, 120 are arranged offset to one another in a suitable manner so that the electrode fingers 146, 148, 150, 152 are shifted with respect to each other in an alternating manner in the top view.

Figure 13:
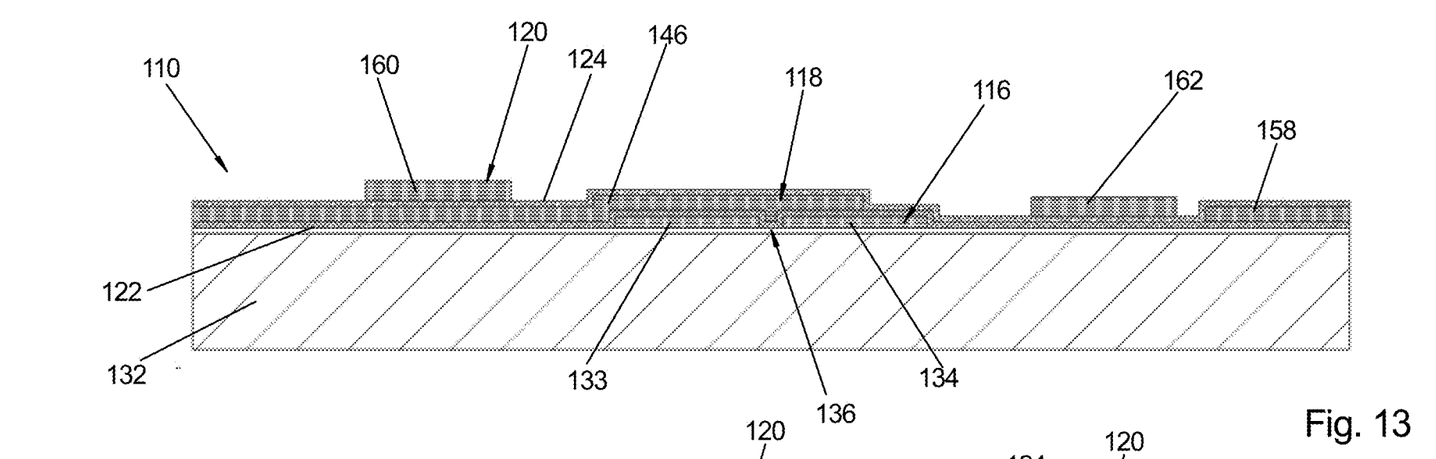
FIG. 13 shows a schematic diagram of a cross-section through the second layer of the gate electrode assembly according to FIG. 9.
Figure 14:
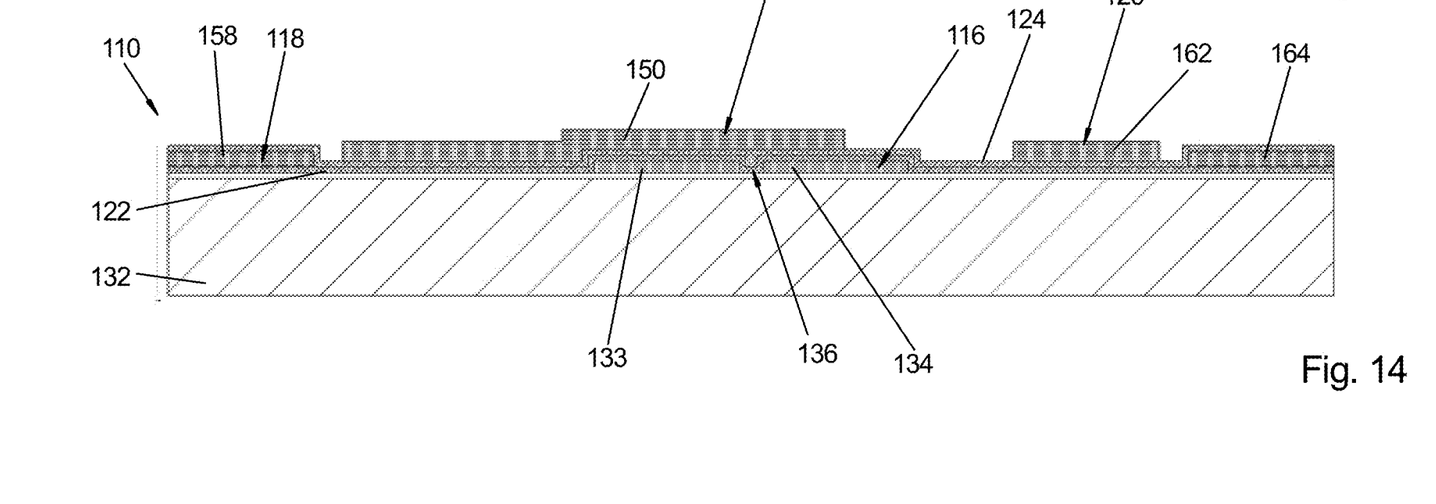
FIG. 14 shows a schematic diagram of a cross-section through the third layer of the gate electrode assembly according to FIG. 9.

FIGS. 13 and 14 each schematically show a cross-section of the electronic component 110. FIG. 13 shows a section through the electrode finger 146 of the second layer, and FIG. 14 shows a section through the electrode finger 150 of the third layer. The gate electrode assemblies 116, 118, 120 and the insulating layers 122, 124 are arranged above the substrate 132.

In FIG. 13, the channel-like structure 136 of the first gate electrode assembly 116, which rests directly on the substrate 132, becomes clear. The channel-like structure 136 is formed significantly narrower than in the first exemplary embodiment according to FIG. 1-8. For this purpose, the two gate electrodes 133, 134 are arranged in parallel with a channel-like structure 136. The first insulating layer 122 is provided over the gate electrodes 133, 134. The second gate electrode assembly 118 is located on this insulating layer 122. One electrode finger 146 of the gate electrode 138 of the second gate electrode assembly 118 is visible on the first insulating layer 122 in this diagram of the sectional area. In the sectional diagram, one connection 158 for the electrode finger 148 of gate electrode 140 of the second gate electrode assembly 118 is visible. The second insulating layer 124, on which the third gate electrode assembly 120 is arranged, is provided over the second gate electrode assembly 118. In the section shown, only one connection 160, 162 of each of the gate electrodes 142, 144 of the third gate electrode assembly 120 is visible between the electrode fingers 150, 152.

Analogous to FIG. 13, the channel-like structure 136 of the first gate electrode assembly 116 is also visible in the section of FIG. 14, which extends unchanged along the entire electronic component 110 (see FIG. 9). In FIG. 13, the first gate electrode assembly 116 lies on the substrate 132. The first insulating layer 122 is located above the gate electrodes 133, 134 of the gate electrode assembly 116. The second gate electrode assembly 118 is located on this insulating layer 122. In the section shown, only the connection 158, 164 of each of the gate electrodes 138, 140 of the second gate electrode assembly 118 is visible between the electrode fingers 146, 148. The second insulating layer 124, on which the third gate electrode assembly 120 is arranged, is provided over the second gate electrode assembly 118. One electrode finger 150 of the gate electrode 142 of the third gate electrode assembly 120 is visible on the second insulating layer 124 in this diagram of the sectional area. Only the connection 162 of the gate electrode 144 of the third gate electrode assembly 120 is visible here.

Figure 15:
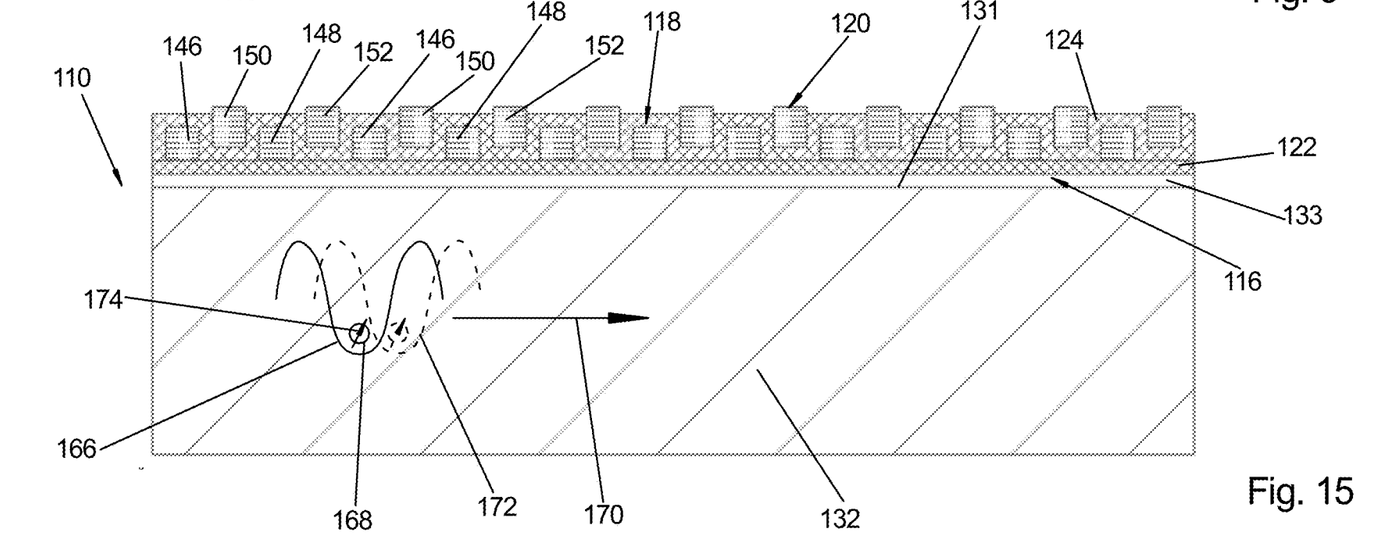
FIG. 15 shows a longitudinal section according to FIG. 9 through the electronic component.

FIG. 15 shows, as a section of the electronic component 110, a longitudinal section, the plane of which is situated between the channel-like structure 136. The two-dimensional electron gas (2DEG) is formed in the substrate 132 of the electronic component 110. In this cross-sectional view, the gate electrode 133 of the first gate electrode assembly 116 is visible. The gate electrode 133 extends longitudinally directly on the outer surface 131 of the substrate 132 and is separated from the second gate electrode assembly 118 by the first insulating layer 122.

The transverse electrode fingers 146, 148 of the second gate electrodes 138, 140 can be seen in section. The second gate electrode assembly 118 is separated from the third gate electrode assembly 120 by the second insulating layer 124. Of the third gate electrode assembly 120, only the electrode fingers 150, 152 of the gate electrodes 142, 144 can be seen. In this section, it becomes clear how the electrode fingers 146, 148, 150, 152 alternate. By suitably applying voltages to the gate electrode assemblies 116, 118, 120, a potential well 166 is generated. A quantum dot 168 trapped in this potential well 166 can be transported through the substrate. The potential well 166 is transported longitudinally through the substrate through suitable control of the electrode fingers 146, 148, 150, 152 with voltages, without the quantum dot 168 changing its quantum mechanical properties.

Voltage is applied to the gate electrode assemblies 116, 118, 120 such that the electrode fingers 146, 148, 150, 152 of the gate electrodes 138, 140 and 142, 144 form the movable potential well 166 in the substrate 132 of the electronic component 110. Through suitable control of the gate electrode assemblies 116, 118, 120, the potential well 166 can be guided in a controlled manner along the channel-like structure 136 through the substrate 132. In the present exemplary embodiment, the gate electrodes 138, 140 and 142, 144 of the second and third gate electrode assemblies 118, 120 have a sinusoidal voltage profile applied to them, which is suitably phase-shifted between the gate electrodes 138, 140, 142, 144. The quantum dot 168, which is confined in this potential well 166, can be transported with this potential well 166 over a distance in the two-dimensional electron gas of the substrate 132 made of SiGe from one qubit 112 to the other qubit 114 without experiencing a quantum mechanical change of state. The movement of the quantum dot 168 in the direction of the arrow 170 is indicated by a dashed line 172. The quantum mechanical state is represented symbolically by the small arrow 174 of the quantum dot 168.

It should be noted that instead of an electron, as in the previous exemplary embodiments, which forms the quantum dot 68 with a defined quantum mechanical state, holes can also be considered quantum dots in which an electron is correspondingly missing.

LIST OF REFERENCE SIGNS

10 Electronic component
12, 14 Qubit
16 First gate electrode assembly
18 Second gate electrode assembly
20 Third gate electrode assembly
22 First insulating layer
24 Second insulating layer
26, 28, 30 Electrical connections
31 Outer surface of the substrate
32 Substrate (GaAs)
33, 34 Gate electrode (1st layer)
36 Channel-like structure
38, 40 Gate electrode (2nd layer)
42, 44 Gate electrode (3rd layer)
46, 48 Electrode finger (2nd layer)
50, 52 Electrode finger (3rd layer)
54, 56 Plane (first gate electrode assembly)
58 Connection (2nd layer)
60, 62 Connection (3rd layer)
64 Connection (2nd layer)
66 Potential well
68 Quantum dot (electron)
70 Direction of arrow
72 Dashed lines (potential well)
74 Arrow
110 Electronic component
112, 114 Qubit
116 First gate electrode assembly
118 Second gate electrode assembly
120 Third gate electrode assembly
122 First insulating layer
124 Second insulating layer
126, 128, 130 Electrical connections
131 Outer surface of the substrate
132 Substrate (SiGe)
133, 134 Gate electrode (1st layer)
136 Channel-like structure
138, 140 Gate electrode (2nd layer)
142, 144 Gate electrode (3rd layer)
146, 148 Electrode finger (2nd layer)
150, 152 Electrode finger (3rd layer)
154, 156 Plane (first gate electrode assembly)
158 Connection (2nd layer)
160, 162 Connection (3rd layer)
164 Connection (2nd layer)
166 Potential well
168 Quantum dot (hole)
170 Direction of arrow
172 Dashed lines (potential well)
174 Arrow

The invention claimed is:

1. An electronic component, which is designed as a semiconductor structure for moving a quantum dot over a distance, comprising:
    a substrate with a two-dimensional electron gas or electron hole gas;
    a gate electrode assembly having gate electrodes, which is arranged on a surface of the electronic component, for producing a potential well in the substrate; and
    electrical terminals for connecting the gate electrode assembly to voltage sources,
    wherein the gate electrodes are electrically insulated from one another by insulating layers and have parallel electrode fingers, and
    wherein the parallel electrode fingers are interconnected in a periodically alternating manner, which causes an almost continuous movement of the potential well through the substrate, whereby a quantum dot is transported with this potential well.

2. The electronic component according to claim 1, wherein the gate electrodes are two parallel, gate electrodes which form a channel-like structure.

3. The electronic component according to one of claim 1, wherein the substrate of the electronic component comprises gallium arsenide and/or silicon germanium.

4. The electronic component according to claim 1, wherein the gate electrodes, which are interconnected, are configured such that a periodic and/or phase-shifted voltage can be applied to them.

5. The electronic component according to claim 1, wherein every third one of the parallel electrode fingers of the gate electrodes is interconnected.

6. A method for the electronic component according to claim 1, comprising:
    applying a phase-shifted voltage to gate electrodes which are electrically insulated from one another by insulating layers, thereby
    causing an almost continuous movement of the potential well through the substrate, and thereby transporting the quantum dot with the potential well.

7. The method according to claim 6, wherein every fourth of the gate electrodes is interconnected and to which a periodic voltage is applied.

* * * * *